United States Patent [19]

Hammel et al.

[11] Patent Number: 5,565,810
[45] Date of Patent: Oct. 15, 1996

[54] SWITCH WITH A FIRST SWITCHING ELEMENT IN THE FORM OF A BIPOLAR TRANSISTOR

[75] Inventors: Hermann Hammel, Rot am See; Horst Häfner, Heilbronn; Jürgen Schnabel, Leingarten; Henrik Gutsch, Heilbronn, all of Germany

[73] Assignee: TEMIC TELEFUNKEN microelectronic GmbH, Heilbronn, Germany

[21] Appl. No.: 418,475

[22] Filed: Apr. 7, 1995

[30] Foreign Application Priority Data

Apr. 9, 1994 [DE] Germany .......................... 44 12 274.8

[51] Int. Cl.[6] .......................... G05F 1/10; H03K 17/60; H03B 1/00
[52] U.S. Cl. .......................... 327/542; 327/478; 327/432; 327/108
[58] Field of Search .......................... 327/483, 542, 327/575, 432, 478, 108, 432; 323/289

[56] References Cited

U.S. PATENT DOCUMENTS

| 3,955,103 | 5/1976 | Russell et al. | 327/432 |
| 4,867,101 | 10/1990 | Nakamura et al. | 323/289 |
| 5,134,323 | 7/1992 | Congdon | 327/483 |

FOREIGN PATENT DOCUMENTS

| 360226224 | 11/1985 | Japan | 327/483 |
| 62164671 | 6/1987 | Japan |  |

Primary Examiner—David C. Nelms
Assistant Examiner—Trong Phan
Attorney, Agent, or Firm—Spencer & Frank

[57] ABSTRACT

A switch is described with a bipolar transistor as first switching element having a high breakdown voltage when operated in the reverse direction. This can be accomplished by a second switching element provided in the switch, a switching transistor, e.g. an MOS transistor, through which the base and the collector of the bipolar transistor are joined together, is activated in the reverse mode of the switch, i.e. when the bipolar transistor is in inverse mode, in such a way that the second switching element becomes conductive. The collector-emitter breakdown voltage of the bipolar transistor, i.e. its maximum permissible collector-emitter voltage, is thus brought closer to its higher base-emitter breakdown voltage.

13 Claims, 2 Drawing Sheets 5,565,810

SWITCH WITH A FIRST SWITCHING ELEMENT IN THE FORM OF A BIPOLAR TRANSISTOR

BACKGROUND OF THE INVENTION

In conventional circuits, a switch can be operated to connect a first circuit section to a second circuit section. If, for instance, the first circuit section has a current source, this can be connected to the second circuit section when required by operating the switch. The bipolar transistor used as switching element of the switch is usually operated in the forward direction. When the bipolar transistor is operated in inverse mode (in the reverse direction), it switches reliably only as long as its collector-emitter voltage does not exceed the collector-emitter breakdown voltage. As soon as its collector-emitter voltage exceeds this value, the bipolar transistor breaks down with the result that a considerable leakage current can be supplied via the bipolar transistor to the first circuit section where it creates undesirable temporary or even permanent functional disturbances.

SUMMARY OF THE INVENTION

The object of the invention is to provide a switch that is of simple design and has a high dielectric strength when operated in reverse direction. This object is solved in accordance with an embodiment of the invention described herein.

The switch according to the invention that connects a first circuit section to a second circuit section has a first switching element (a bipolar transistor, preferably an npn transistor) and a second switching element (a switching transistor, preferably an MOS transistor). The base of the bipolar transistor is connected to the first circuit connection of the switching transistor and the collector of the bipolar transistor is connected to the second circuit connection of the switching transistor. The control connection of the switching transistor is connected to a control signal source, preferably via the emitter of the bipolar transistor to the input of the second circuit section that is connected to the emitter. The control connection of the switching transistor is preferably connected to the emitter of the bipolar transistor preferably through a decoupling resistor. As soon as the bipolar transistor is operated in the inverse mode, the switching transistor becomes conductive (which is the case in the npn transistor when the emitter potential exceeds the collector potential). Base and collector of the bipolar transistor are connected together in this way with low resistance. With this low-resistance connection, the collector-emitter breakdown voltage is determined essentially by the base-emitter breakdown voltage. The latter is higher than the collector-emitter breakdown voltage of the bipolar transistor with non-connected base so that its maximum permissible collector-emitter voltage must be increased in the inverse mode.

If the switching transistor of the switch is provided as an MOS transistor, a high-voltage NMOS transistor is preferred. The voltage limitations of conventional MOS transistors do not apply to such a high-voltage NMOS transistor, at least not with respect to its drain connection.

It is sometimes necessary to protect the gate connection of MOS transistors against excessively high voltages. This is accomplished preferably with a Z-diode joined to the gate connection that prevents a rise of the gate potential to values that are unacceptable for operation of the MOS transistor $M_{10}$. The decoupling of the gate and the emitter potentials, which is desirable in particular when the Z-diode is conductive, is accomplished preferably with a decoupling resistor provided between the gate connection of the MOS transistor and the emitter connection of the bipolar transistor.

Because of its simple design, the switch according to the invention is space-saving and can be integrated in an IC at low-cost.

The switch can be used wherever high collector-emitter voltages can occur in the inverse mode of operation of a bipolar transistor.

DESCRIPTION OF THE PREFERRED EMBODIMENTS

The invention will now be described in more detail on the basis of FIGS. 1 and 2.

Figure 1:
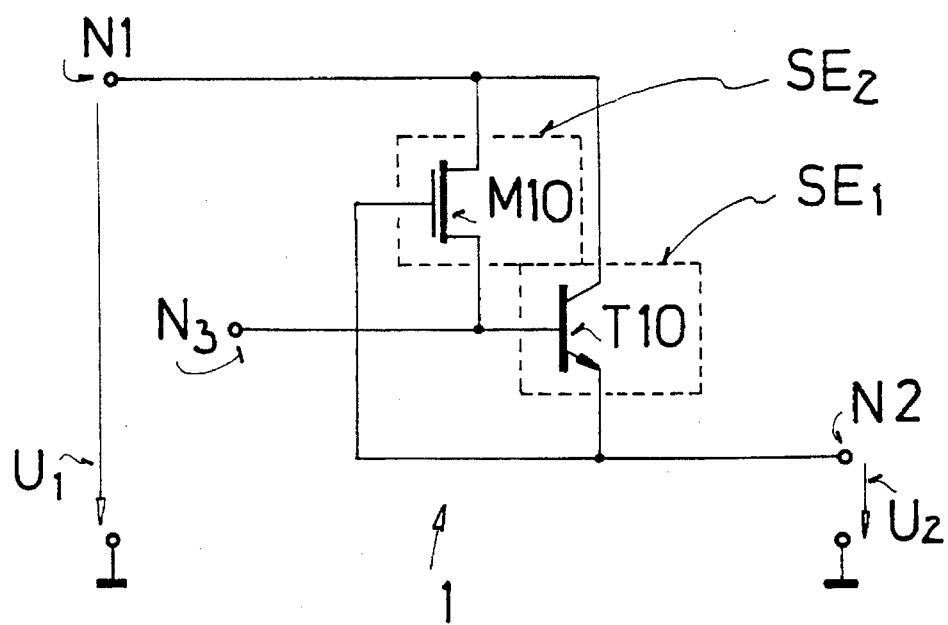
FIG. 1 A first embodiment example.

FIG. 1 shows the arrangement of a switch 1 in accordance with the invention comprising only a first switching element SE1 and a second switching element SE2. The first switching element SE1 is the npn type of bipolar transistor $T_{10}$, and the second switching element SE2 is the MOS transistor designated as $M_{10}$ and provided as switching transistor $M_{10}$ in the form of a high-voltage NMOS transistor. The drain connection of the MOS transistor $M_{10}$ and the collector connection of the bipolar transistor $T_{10}$ are joined to the first node N1 of switch 1. The gate connection of the MOS transistor $M_{10}$ and the emitter of the bipolar transistor $T_{10}$ are bonded with the second node N2 of switch 1. The source connection of the MOS transistor $M_{10}$ and the base connection of the bipolar transistor $T_{10}$ are connected to the third node N3 of the switch 1.

In the forward mode, the MOS transistor $M_{10}$ is inactive; it is non-conductive because its gate potential is at the same level as the emitter potential, i.e. at the lowest potential level.

In the non-conductive state, i.e. when the bipolar transistor $T_{10}$ is non-conductive, the voltage $U_2$ at node N2 can exceed the value of the voltage $U_1$ at node N1 because of the circuit sections connected to the first and second nodes N1 and N2. The bipolar transistor $T_{10}$ is then in the inverse mode and the MOS transistor $M_{10}$ is in the conductive state. Consequently, the collector and the base of the bipolar transistor $T_{10}$ are connected together with low resistance. For this reason, the value of the collector-emitter breakdown voltage of the bipolar transistor $T_{10}$ is determined largely by the breakdown voltage of its base-emitter diode.

Figure 2:
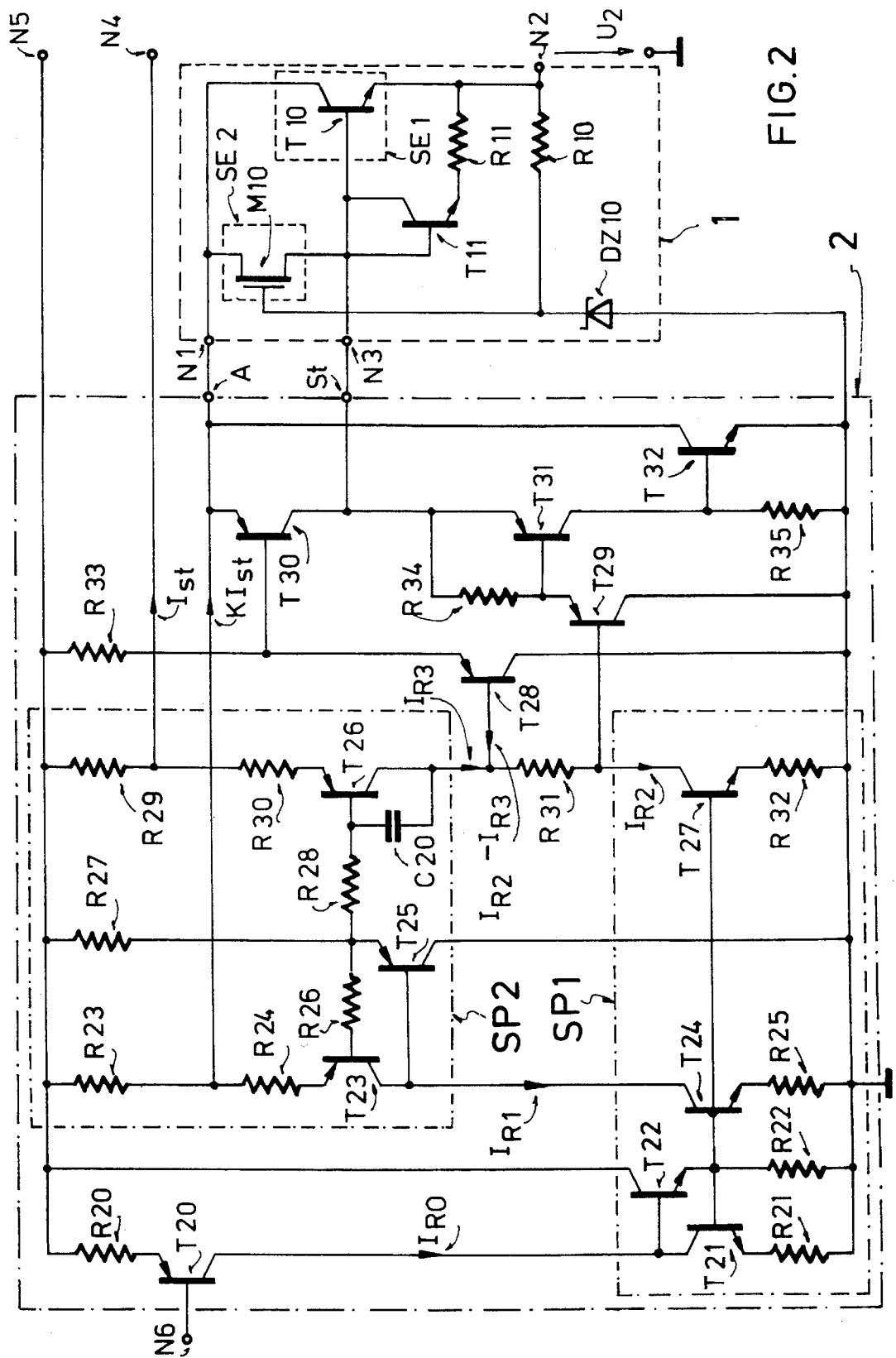
FIG. 2 A second embodiment example.

FIG. 2 shows switch 1 and the first circuit section, made in the form of a current multiplier 2, joined to it. Switch 1 is joined to the output A of the current multiplier 2 through the node N1 and to the control output St of the current multiplier 2 through the node N3. The node N2 of switch 1 is connected to a second circuit section, not shown in FIG. 2, that receives the current supplied from the output A of the current multiplier. Node N4 of the current multiplier 2 is made in the form of a control connection through which the current (the multiplication current $kI_{St}$) fed into the node N1 of switch 1 is set. The multiplication current $kI_{St}$ is proportional to the control current $I_{St}$ taken from the node N4. The node N5 is a supply connection joined to a source of supply and the node N6 is another control connection used for setting the working point of the current multiplier 2.

The switch 1 shown in FIG. 2 is an expanded version of the switch 1 shown in FIG. 1. The gate connection of the MOS transistor $M_{10}$ is joined to the cathode of a Z-diode $DZ_{10}$. In this way, the gate potential is limited to the permissible values for operation of the MOS transistor. The gate potential of the MOS transistor $M_{10}$ is decoupled from the emitter potential of the bipolar transistor $T_{10}$, i.e. from the voltage $U_2$, with the decoupling resistor $R_{10}$ that is provided between the gate connection of the MOS transistor $M_{10}$ and the emitter connection of the bipolar transistor $T_{10}$. The base and the emitter of the bipolar transistor $T_{10}$ are joined together through a transistor $T_{11}$ connected as a diode and a discharge resistor $R_{11}$ connected in series with it.

The current multiplier 2 has two current mirrors SP1 and SP2. The reference current $I_{R0}$ can be varied through a current that must be fed into the base of the transistor $T_{20}$ at the node N6. The npn transistor $T_{21}$ that is connected as current sink of the current mirror SP1 takes up this reference current. Since in this particular case the two resistors $R_{25}$ and $R_{32}$ are of equal size and the two transistors $T_{24}$ and $T_{27}$ connected as current sources are npn transistors of similar type, the two mirror currents (referred to below as quiescent current $I_{R1}$ and quiescent current $I_{R2}$) are of equal magnitude and proportional to the reference current $I_{R0}$. The pnp transistor $T_{23}$ connected as current sink of the current mirror SP2 takes up the quiescent current $I_{R1}$. The pnp transistor $T_{26}$ is provided as current source of the current mirror SP2. The current supplied by it (the mirror current $I_{R3}$) is proportional to the quiescent current $I_{R1}$. The proportionality factor (the current ratio) of this current mirror SP2 is equal to 1, provided no control current $I_{St}$ is drawn from the node N4, i.e. as long as no load is imposed on the voltage divider made up of resistors $R_{29}$ and $R_{30}$. As soon as a load is placed on this voltage divider, or in other words as soon as the control current $I_{St}$ becomes greater than zero, the emitter potential of the transistor $T_{26}$ changes. This leads to a reduction in the current ratio of the current mirror SP2 and therefore also of the mirror current $I_{R3}$. Since this results in the mirror current $I_{R3}$ being smaller than the two equally large quiescent currents $I_{R1}$ and $I_{R2}$, a base current $I_{R2}-I_{R3}$ can flow from the pnp transistor $T_{28}$ into the resistor $R_{31}$. The transistor $T_{28}$ which thus becomes conductive then takes up the base current of the pnp transistor $T_{30}$. This in turn becomes conductive and, through the control output St of the current multiplier, supplies a base current to the bipolar transistor $T_{10}$ so that this too changes over to the conductive state. The latter loads the voltage divider made up of resistors $R_{23}$ and $R_{24}$ and connected to the output A of the current multiplier 2. Consequently, the emitter potential of the transistor $T_{23}$ is shifted to lower voltages and thus the current ratio of the current mirror SP2 is increased. Owing to the control loop formed by this feedback, the multiplication current $kI_{St}$ flowing from the voltage divider $R_{23}$, $R_{24}$ settles down to a value that is proportional to the control current $I_{St}$. The proportionality factor depends on the resistance values selected for the resistors $R_{23}$, $R_{24}$, $R_{29}$ and $R_{30}$. The capacitor $C_{20}$ connected to the base and the collector of the transistor $T_{26}$ is provided to suppress the tendency of the control loop to oscillate.

If, because of the second circuit section connected to node N2, the multiplication current $kI_{St}$ cannot flow out from this node, the collector-emitter voltage of the transistor $T_{30}$ assumes its minimum value which is approximately of the same magnitude as the voltage drop across the resistor $R_{31}$. The collector potential of the transistor $T_{30}$ and therefore also the emitter potentials of the two pnp transistors $T_{29}$ and $T_{31}$ are elevated as a result; the transistors $T_{29}$ and $T_{31}$ become conductive. Consequently, the npn transistor $T_{32}$ also obtains a base current so that, having become conductive, it in turn takes up the multiplication current $kI_{St}$ and discharges to ground. In this way, it is ensured that the load on the supply source to be connected to the node N5 does not vary as a function of the current flowing out of the node N2. This is necessary in particular when the supply source is at the same time a signal source where a change in load would result in a change in the signal.

What is claimed is:

1. A switch for connecting a first circuit section with a second circuit section, the switch comprising:

a first bipolar transistor switching element, a first node connected to the collector of the first bipolar transistor switching element and connected to the output of the first circuit section, a second node connected to the emitter of the first bipolar transistor switching element and connected to the input of the second circuit section, and a third node connected as a switch input terminal to the base of the of the first bipolar transistor switching element and through which the switch is activated, and a second switching transistor switching element with first and second circuit connections and one control connection, wherein:

the first circuit connection of the second switching transistor switching element is connected to the first node and the collector of the first bipolar transistor switching element, the second circuit connection of the second switching transistor switching element is connected to the third node and the base of the first bipolar transistor switching element, and the second switching transistor switching element is activated by a control signal source which is connected to the control connection of the second switching transistor switching element, wherein, when the switch is operating in the reverse mode, i.e. when the first bipolar transistor switching element is in the inverse mode, the second switching transistor switching element becomes conductive.

2. The switch in accordance with claim 1, wherein the second switching transistor switching element is a MOS transistor whose drain connection forms the first circuit connection thereof, whose gate connection forms the control connection thereof, and whose source connection forms the second circuit connection thereof.

3. The switch in accordance with claim 2, wherein:

the control connection of the second switching transistor switching element is operatively connected to the second node and the emitter of the first bipolar transistor switching element, and the second circuit section through the second node is the control signal source for the second switching transistor switching element.

4. The switch in accordance with claim 3, further comprising a decoupling resistor, wherein the control connection of the second switching transistor switching element is operatively connected to the second node and the emitter of the first bipolar transistor switching element through the decoupling resistor.

5. The switch in accordance with claim 4, further comprising:

a transistor configured as a diode, and a discharge resistor connected in series with the transistor configured as a diode, wherein the base and the emitter of the first bipolar transistor switching element are operatively connected by the series connection of the transistor configured as a diode and the discharge resistor connected with it in.

6. The switch in accordance with claim 5, wherein the first bipolar transistor switching element is an npn transistor.

7. The switch in accordance with claim 6, further comprising a Zener diode coupled to the gate connection of the second transistor switching element MOS transistor for limiting the gate potential thereof.

8. The switch in accordance with claim 7, wherein the second transistor switching element MOS transistor is an NMOS transistor.

9. The switch in accordance with claim 8, wherein the second transistor switching element NMOS transistor is a high-voltage NMOS transistor.

10. The switch in accordance with claim 1, further comprising:

a transistor configured as a diode, and a discharge resistor connected in series with the transistor configured as a diode, wherein the base and the emitter of the first bipolar transistor switching element are operatively connected by the series connection of the transistor configured as a diode and the discharge resistor.

11. The switch in accordance with claim 1, further comprising a Zener diode coupled to the control connection of the second switching transistor switching element for limiting the control connection potential.

12. The switch in accordance with claim 1, wherein the first circuit section is a current multiplier and the second circuit section is a circuit for receiving current supplied by the current multiplier through the switch.

13. The switch in accordance with claim 2, further comprising a Zener diode coupled to the gate connection of the second transistor switching element MOS transistor for limiting the gate potential thereof.

* * * * *